US012572085B2

(12) United States Patent
Seidel et al.

(10) Patent No.: US 12,572,085 B2
(45) Date of Patent: Mar. 10, 2026

(54) DEVICE AND METHOD FOR MEASURING SUBSTRATES FOR SEMICONDUCTOR LITHOGRAPHY

(71) Applicant: Carl Zeiss SMT GmbH, Oberkochen (DE)

(72) Inventors: Dirk Seidel, Jena-Leutra (DE); Ulrich Matejka, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 962 days.

(21) Appl. No.: 17/746,272

(22) Filed: May 17, 2022

(65) Prior Publication Data

US 2022/0276571 A1     Sep. 1, 2022

Related U.S. Application Data

(63) Continuation of application No. PCT/EP2020/082194, filed on Nov. 16, 2020.

(30) Foreign Application Priority Data

Nov. 20, 2019    (DE) .......................... 102019131327.9

(51) Int. Cl.
*G03F 7/00*              (2006.01)
(52) U.S. Cl.
CPC ...... *G03F 7/70641* (2013.01); *G03F 7/70375* (2013.01)
(58) Field of Classification Search
CPC .... G03F 7/70641; G03F 7/70375; G03F 1/84; G03F 7/70316; G02B 5/1857; G02B 5/1842; G02B 5/1866; G02B 7/38
See application file for complete search history.

(56) References Cited

U.S. PATENT DOCUMENTS 6,388,734 B1 *   5/2002   Tokuda ............... G03F 7/70891
                                                   355/53
7,652,758 B2 *   1/2010   Park .................... G03F 7/70525
                                                   430/30
(Continued)

FOREIGN PATENT DOCUMENTS

DE        101 09 929 A1    11/2001    ................ G01J 3/24
DE        103 23 664 A1    12/2004    ................ G01J 1/02
(Continued)

OTHER PUBLICATIONS

Final Office Action issued by the Taiwan Patent Office for Application No. TW 10913986, dated Aug. 1, 2022 (With English Translation).

(Continued)

*Primary Examiner* — Hung V Nguyen
(74) *Attorney, Agent, or Firm* — Fish & Richardson P.C.

(57)          ABSTRACT

The invention relates to a device for measuring a substrate for semiconductor lithography, comprising an illumination optical unit, an imaging optical unit and a recording device arranged in the image plane of the imaging optical unit, a diffractive element being arranged in the pupil of the imaging optical unit.

The invention also relates to a method for measuring a substrate for semiconductor lithography with a measuring device, the measuring device comprising an imaging optical unit with a pupil, with the following method steps: arranging a diffractive element in the pupil of the imaging optical unit for producing a multifocal imaging, capturing the imaging of a partial region of the substrate, and evaluating the imaging.

16 Claims, 6 Drawing Sheets

(56) References Cited

U.S. PATENT DOCUMENTS

| | | | |
|---|---|---|---|
| 8,049,864 B2* | 11/2011 | Kok | G03F 7/706 |
| | | | 355/53 |
| 8,736,849 B2 | 5/2014 | Stroessner et al. | |
| 9,235,142 B2* | 1/2016 | Manger | G03F 7/70191 |
| 9,551,941 B2 | 1/2017 | Ruoff et al. | |
| 9,983,483 B2* | 5/2018 | Patra | G03F 7/70158 |
| 11,143,967 B2 | 10/2021 | Gruner | |
| 2002/0001088 A1 | 1/2002 | Wegmann et al. | |
| 2009/0290136 A1 | 11/2009 | Ouchi et al. | |
| 2011/0216297 A1* | 9/2011 | Baselmans | G03F 7/70066 |
| | | | 355/67 |
| 2011/0242544 A1 | 10/2011 | Stroessner et al. | |
| 2013/0176622 A1 | 7/2013 | Abrahamsson et al. | |
| 2016/0004164 A1 | 1/2016 | Ruoff et al. | |
| 2016/0116851 A1* | 4/2016 | Hetzler | G03F 7/70616 |
| | | | 355/67 |
| 2016/0350935 A1 | 12/2016 | Manger | |
| 2016/0370710 A1 | 12/2016 | Wardenier et al. | |
| 2018/0299782 A1 | 10/2018 | Wegmann | |
| 2019/0107776 A1 | 4/2019 | Thaler et al. | |
| 2019/0171114 A1 | 6/2019 | Staals et al. | |
| 2020/0081350 A1 | 3/2020 | Gruner | |
| 2022/0026814 A1 | 1/2022 | Gruner | |

FOREIGN PATENT DOCUMENTS

| | | | | |
|---|---|---|---|---|
| DE | 102008048660 | 3/2010 | | G03F 1/00 |
| DE | 102013202948 | 9/2014 | | G03F 7/20 |
| DE | 102013224583 | 6/2015 | | G01B 11/00 |
| DE | 102015226571 | 6/2017 | | G01B 9/02 |
| DE | 102017208340 | 11/2018 | | G03F 7/20 |
| GB | 2 428 491 A | 1/2007 | | G02B 17/08 |
| TW | 201708934 | 3/2017 | | G03F 1/42 |
| TW | 201937298 | 9/2019 | | G03F 7/20 |
| WO | WO 2016/189095 | 12/2016 | | G02B 5/18 |

OTHER PUBLICATIONS

Office Action issued by the German Patent Office for Application No. DE 10 2019 131 327.9, dated Dec. 2, 2024 (with English Translation).

The Office Action issued by the German Patent Office for Application No. DE 10 2019 131 327.9, dated Jul. 1, 2020 (with English Translation).

The International Search Report and Written Opinion of the International Searching Authority for International Application No. PCT/EP2020/082194, dated Mar. 9, 2021.

Abrahamsson et al., "Fast multicolor 3D imaging using aberration-corrected multifocus microscopy", *Nature Methods*, vol. 10, No. 1, pp. 60-63 (Dec. 9, 2012).

He et al., "Computational multifocal microscopy", ARXIV.Org, Cornell University Library, 201 Olin Library Cornell University, Ithaca, NY (Sep. 4, 2018).

Office Action and Search Report issued by the Taiwan Patent Office for Application No. TW 109139865 dated Jun. 27, 2024 (with English Machine Translation).

* cited by examiner

Stand der Technik

29

31.2

30

30

31.1

31.4

31.7

31.5    31.8

31.3

31.6

31.9

31.1

31.2

31.3

31.4

31.5

31.6

31.7

31.8

31.9

41

42

43

DEVICE AND METHOD FOR MEASURING SUBSTRATES FOR SEMICONDUCTOR LITHOGRAPHY

CROSS-REFERENCE TO RELATED APPLICATIONS

The present application is a continuation of and claims priority under 35 U.S.C. § 120 from PCT application PCT/EP2020/082194, filed on Nov. 16, 2020, which claims the priority of the German patent application DE 10 2019 131 327.9 of Nov. 20, 2019. The contents of the above applications are fully incorporated herein by reference.

TECHNICAL FIELD

The invention relates to a device and a method for measuring substrates, in particular photomasks for semiconductor lithography.

BACKGROUND

In the metrology of objects such as substrates, which may be formed for example as photomasks for semiconductor lithography, defocusing information, that is to say how imaging changes when there are differing degrees of defocusing of the imaging, is of great importance in the measurement of the substrates. Usually a so-called focus stack of the image of the substrate is produced by the moving of the measuring table or the support on which the substrate lies, that is to say a number of images are recorded one after the other for different z positions of the measuring table; the z direction in this case corresponds substantially to the normal on the focal plane of the optical system. The imagings of the focus stack can then be used for example to make an assertion about the so-called printability, that is to say the correct imaging of an object onto a wafer in a projection exposure apparatus over a region around the best focus. The best focus is in this case the distance of the object from the imaging optical unit at which the image is in sharpest focus.

Another application in which the focus stack is used is the autofocusing of optical imaging devices. In many measuring machines, the object to be measured, such as for example a photomask, has to be brought into the best focus of the imaging system in order to obtain a sharp image of the object or partial regions thereof, the so-called field of view (FoV). Usually a number of partial regions of the object are measured, the object having to be refocused for each partial region, that is to say the surface having to be positioned into the best focus of the imaging device. In order to ensure a high throughput, this focusing is intended to take place as fast as possible, that is to say with the fewest possible test measurements. One type of focusing known in the prior art, in which a region around the expected focus in the imaging direction (z axis), which is also referred to as the defocus region, with many individual images is measured and used to determine the sharpest image, and thus the best focus is determined, but does not satisfy the conditions in respect of throughput.

SUMMARY

An aspect of the present invention is to provide a device which resolves the disadvantages of the prior art described above. A further aspect of the invention is to specify an improved method for measuring substrates.

This aspect is achieved by a device and a method having the features of the independent claims. The dependent claims relate to advantageous developments and variants of the invention.

A device according to the invention for measuring a substrate, formed in particular as a photomask, for semiconductor lithography comprises an illumination optical unit, an imaging optical unit and a recording device arranged in the image plane of the imaging optical unit, a diffractive element being arranged in the pupil of the imaging optical unit. The arrangement of a diffractive element causes the imaging of the substrate to be multiplied and transformed into a number of partial imagings because of diffractive effects. The number and size of the partial imagings depend in this case on the period of the grating of the diffractive element and the size of the exposed part of the substrate, and in the case of a recording device formed as a camera on the size of the CCD chip used. It is therefore expedient to choose the size of the exposed region of the substrate and the period of the diffractive element so as to ensure the most efficient possible use of the CCD chip. The fact that a number of partial imagings can be produced allows just a single recording to achieve an effect that corresponds to the recording of a number of individual images.

In particular, the illumination optical unit can comprise a stop arranged in the field plane. The stop can delimit the imaged region of the substrate, whereby mutual crosstalk between the partial imagings in the recording device, in particular on the CCD chip, can be avoided.

Furthermore, the diffractive element can be formed as an amplitude grating. Amplitude gratings, which absorb part of the radiation incident on the grating, are easy to produce. The radiation passing through the transmitting or reflecting regions of the grating interferes because of diffraction effects, which can cause multiple imaging of the imaged substrate.

In addition, the diffractive element can be formed as a phase grating. In the phase grating, the phase of the individual rays is shifted in relation of one to the other due to material of different thicknesses or due to material of different refractive indices. The diffractive effect is identical to that at an amplitude grating, a phase grating having the advantage that no radiation or virtually no radiation is lost.

Furthermore, the diffractive element can be formed as a combination of an amplitude grating and a phase grating.

In a variant of the invention, the grating can comprise a locally varying period in one direction. It is known from the prior art that a locally varying period brings about a defocusing of the partial imagings, for which reason this type of grating is also referred to as a multifocal grating. For a diffraction grating with a fundamental period d, the fringes of which at the location (x, y) are displaced in the x direction by $\Delta x$, the local phase shift $\Phi m$ for each order of diffraction m in relation to the zero order is given by $$\Phi_m(x,y) = 2\pi * m\Delta x(x,y)/d$$

The location dependency of $\Delta x$ is given by $$\Delta x = W * d(x^2 + y^2)/(\lambda R^2),$$

where
$\lambda$ = the wavelength of the light
R = the radius of the grating aperture
W = a constant that determines the distance of the partial imagings from one another
d = the fundamental period
$(x^2 + y^2)/(R^2)$ = a distortion of the basic grating at the location (x,y).

Furthermore, the grating can take the form of a 2D grating (cross grating) and comprise a locally varying period in two directions perpendicular to one another. In this case, the phase shift can be described by the following formula:

$$\Phi_{m,n}(x,y)=2\pi*[m\Delta x(x,y)+n\Delta y(x,y)]/d$$

where $$\Delta x=W_x*d(x^2+y^2)/(\lambda R^2)$$

and $$\Delta y=W_y*d(x^2+y^2)/(\lambda R^2)$$

Such a two-dimensional grating can produce on the sensor a multiplicity of partial imagings in the x and y directions that can correspond to the imagings of a focus stack. It is therefore advantageously possible to produce identical information with just one imaging by a multiplicity of imagings at different distances of the substrate from the imaging optical unit.

Furthermore, the grating can comprise a distortion corresponding to a non-paraxial wavefront of the defocus. Devices for measuring substrates of semiconductor lithography are usually high-aperture systems with a numerical aperture of more than 0.4, for which the paraxial approximation of the defocus no longer applies, as a result of which the multifocal grating described further above would not produce partial imagings corresponding to a focus stack which would be produced with such a device by moving of the substrate. The distortion has the effect that the partial imagings produced by the multifocal grating correspond to a focus stack produced with the device by moving of the substrate. A distortion for non-paraxial defocuses is obtained for example, by the term $x^2+y^2$ in the above formulae being replaced by $[1-(x^2+y^2)]^{1/2}$.

In particular, the diffractive element can be formed such that the imaging comprises a number of partial imagings, which respectively correspond to an imaging with different distances between the substrate and the imaging optical unit, without the use of a diffractive element. It is in this way possible with just one captured imaging to generate the same assertion that would otherwise only be possible after capturing a number of imagings. In addition, between the number of imagings, the substrate must be moved in each case by a certain distance in the direction of the radiation, for example by moving of the measuring table. The movement can mechanically excite the device, as a result of which the imaging quality can be adversely influenced. The use of a diffractive element is consequently advantageous over the prior art because of the fewer captured imagings and because of the better imaging quality.

Furthermore, the diffractive element can be formed such that the radiation energy is allocated equally to the individual partial imagings. Equal is understood in this connection as meaning a maximum deviation of a few percent, in particular less than 2%. In the case of a diffractive element with a homogeneously formed grating, the partial imagings are formed with different energies, the partial imagings with a higher order of diffraction being shown darker, that is to say comprise less energy than those with a lower order of diffraction. This difference can be achieved for example by a phase grating with lines of different depths, that is to say with adapted phase shifting of the light. Alternatively, the recorded partial imagings can also be normalized subsequently to the energy of the partial imaging with the greatest energy.

In a variant of the invention, the diffractive element can be formed such that it can bring about aberrations of a higher order in the imaging. The defocusing corresponds to a wavefront error of a low order, in the case of which the partial imaging is shown displaced by a certain amount in the direction of incidence of the light. Higher aberrations comprise for example a spherical aberration or an astigmatism.

In particular, the diffractive element can be formed such that the aberrations of a higher order that are brought about by the diffractive element can correct aberrations of a higher order of the imaging optical unit. As a result, for example, known imaging errors of a higher order of the imaging optical unit, such as spherical aberration, can be advantageously corrected.

In particular, the diffractive element can be formed such that it is adjustable. This may be the case for example with reflective amplitude gratings, which are formed as so-called multi-mirror arrays. Multi-mirror arrays are mirrors which comprise a multiplicity of microscopic mirrors, it being possible for each individual microscopic mirror to be brought into at least two positions. In a first position, the light is reflected and, in the second position, the light is absorbed or reflected into a region outside the actual imaging beam path.

In addition, the diffractive element can be pivoted into the pupil of the imaging optical unit. As a result, for example in the case of a device formed as a mask inspection microscope, the diffractive element can be pivoted into the pupil of the imaging optical unit instead of the Bertrand optical unit that is usually found in a mask inspection microscope.

Furthermore, the diffractive element can be formed such that it is exchangeable. As a result, various diffractive elements, which differ for example by the distance between the partial imagings defocused in relation to one another, can be used.

In particular, the device can comprise a magazine with a number of differently formed diffractive elements. This has the advantage that, depending on the requirement, the different diffractive elements can be pivoted in with little effort. Consequently, different focus stacks can be recorded, depending on the application.

A method according to the invention for measuring a substrate for semiconductor lithography with a measuring device, the measuring device comprising an imaging optical unit with a pupil, comprises the following method steps:

arranging a diffractive element in the pupil of the imaging optical unit, capturing the imaging at least of a partial region of the substrate, and evaluating the imaging.

The imaging of the substrate can for example be captured by a recording device formed as a camera with a CCD chip, which is arranged in the image plane of the imaging optical unit.

In addition, the imaging can comprise a number of partial imagings of the partial region of the substrate. The diffractive element leads to a multiple imaging of the partial region of the substrate.

In particular, the imaging can comprise nine partial imagings of the partial region of the substrate, which correspond to different defocus positions, that is to say positions with a different distance in each case between the substrate and the imaging optical unit. The different defocus positions can be brought about by a suitable design of the diffractive element with two gratings that are arranged perpendicularly to one another and have a locally varying grating constant.

Furthermore, the radiation energy respectively allocated to the partial imagings can be normalized. The normalizing can in this case be brought about by a correspondingly designed grating of the diffractive element or by a normalizing of the captured partial imagings. In this case, the energy of the partial imaging with the highest energy is defined as the normal and the other partial imagings are normalized to this energy.

In addition, the evaluation of the imaging can comprise a determination of the location of the best focus. The alignment of the substrate at the best focus is essential for many measuring tasks.

Furthermore, a contrast value can be determined for a number of partial imagings, in particular for each of the partial imagings. The normalizing of the energies of the partial imagings allows the determined contrast values to be compared with one another, the partial imaging with the greatest contrast corresponding to an imaging of the partial region of the substrate in focus.

In particular, the distance of the substrate from the best focus can be determined on the basis of the contrast values of the partial imagings. Each partial imaging corresponds to an imaging of the substrate with a displacement by a certain amount in the z direction, that is to say in the direction of the optical axis of the imaging optical unit, one of the partial imagings corresponding to the best focus position. The distance can in this case be determined from the nominal z displacement of the partial imaging with the highest contrast in relation to the partial imaging with the lowest order of diffraction or greatest energy before normalizing.

In a variant of the method, a structure position $(x,y)_n$ on a structure of the substrate that is visible in the image field can be determined for each partial imaging n. The representation $x_n$ on the basis of n and $y_n$ on the basis of n allows the telecentricity of the device to be determined as a linear fit, and allows further systematic aberrations to be determined, such as for example decentering of illumination patterns, or else comatic aberrations of a higher order, which are of central importance in the registration measurement of structures.

Furthermore, the line width of a part of a structure can be determined for each partial imaging.

In particular, the region in which the line width of the structure corresponds to a previously determined setpoint value can be determined on the basis of the line widths of the partial imagings. This determines the process window of a projection exposure apparatus, that is to say which focus deviations of the imaging optical unit can still be accepted for error-free imaging of the structures on the wafer.

BRIEF DESCRIPTION OF DRAWINGS

Exemplary embodiments and variants of the invention are explained in more detail below with reference to the drawing. In the figures.

DETAILED DESCRIPTION

Figure 1:
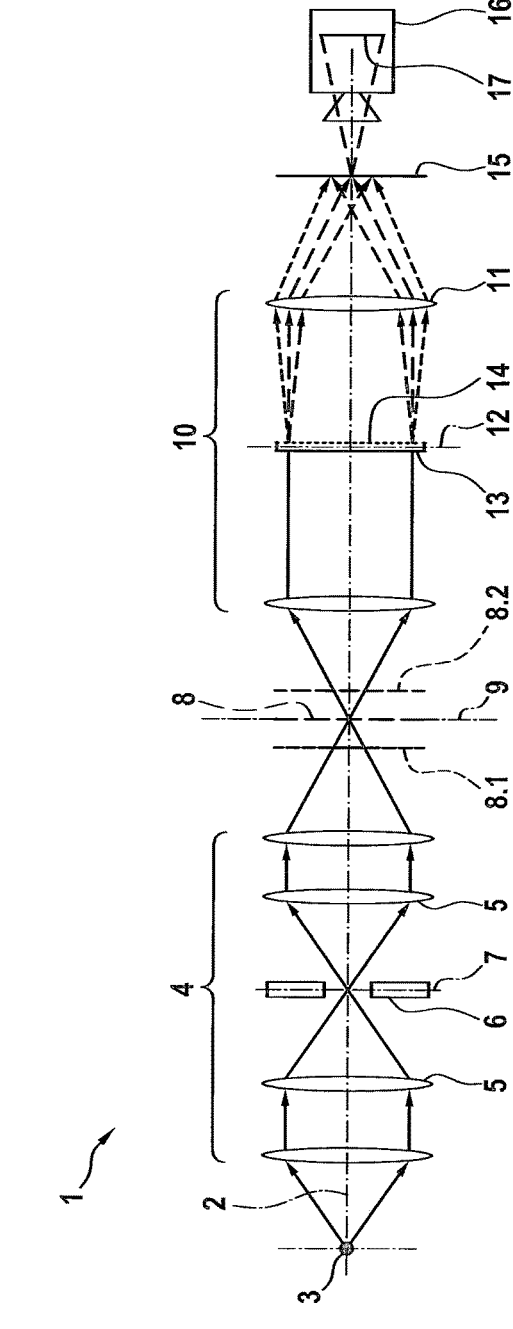
FIG. 1 shows a basic representation of a device according to the invention.

FIG. 1 shows a basic representation of a device 1 according to the invention with a light source 3, an illumination optical unit 4, an imaging optical unit 10 and a recording device formed as a camera 16. The camera 16 captures the imaging, projected onto the image plane 15 by the imaging optical unit 10, of the substrate formed in the example shown as a photomask 8, which is arranged in the object plane 9 of the imaging optical unit 10. The photomask 8 can be moved in the z direction, which corresponds to the direction of the optical axis 2 of the device 1, and can thereby be positioned in the best focus of the imaging optical unit 10. The illumination optical unit 4 comprises optical elements 5 which project the light of the light source 3 as an image onto the object plane 9 of the imaging optical unit 10. Apart from the optical elements 11 which project an image of the structure of the photomask 8 onto the image plane 15, the imaging optical unit 10 comprises a diffractive element 13, which is arranged in the pupil 12 of the imaging optical unit 10. The diffractive element 13 comprises a multifocal grating 14, which brings about the effect that the imaging of the illuminated partial region of the photomask 8 is formed multiply on the image plane 15. The multifocal grating 14 is formed as a two-dimensional grating with a locally varying period, whereby the partial imagings are formed as defocused in relation to one another. In the case of high-aperture objectives, as are usually used in mask inspection microscopes for semiconductor lithography, the grating also comprises a distortion corresponding to a non-paraxial wavefront of the defocus. The partial imagings are formed on the CCD chip 17 of the camera 16, which in the example shown has a size of 25 µm×25 µm. In order to prevent crosstalk of the various partial imagings, the illumination optical unit 4 comprises a stop 6, which is arranged in a field plane 7 of the illumination optical unit 4 and determines the region on the photomask 8 that is illuminated by the light. The region is in this case chosen such that the extent of the partial imagings in the imaging does not exceed a size of 5 µm×5 µm. The rays of light represented in the figure after the diffractive element by variously broken lines show the path of rays of the partial imagings brought about by the diffractive elements 13. These respectively correspond to an imaging of the photomask 8 that was defocused from the best focus in the z direction, which is illustrated by corresponding photomasks 8.1, 8.2 represented by broken lines.

Figure 2A:
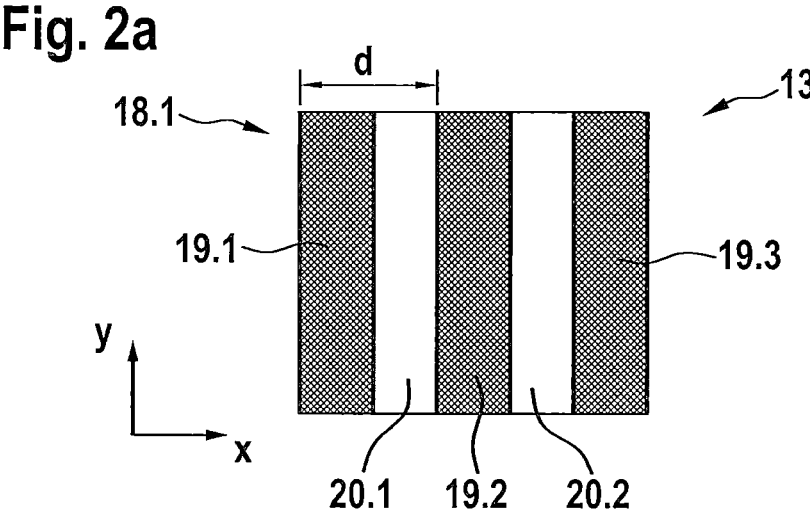
FIGS. 2A-2C show a view of a detail of a diffractive element.

FIG. 2A shows a detail of a diffractive element 13, in which a line grating 18.1 with two different partial regions 19.x, 20.x is represented. The partial regions 19.x, 20.x together form the grating 18.1 with a grating constant d, which is defined as the distance from one first partial region 19.1 to the next first partial region 19.2. If the grating 18.1 is formed as an amplitude grating, the first partial regions 19.x are formed as absorbing regions and the second partial regions 20.x are formed as transmitting regions, or vice versa. The same applies to reflective gratings. In the case of a phase grating, the first partial regions 19.x and the second partial regions 20.x are transparent or reflect the radiation, the second partial regions 20.x bringing about a phase shift of the radiation passing through the grating 18.1 in comparison with the first partial regions 19.x.

Figure 2B:
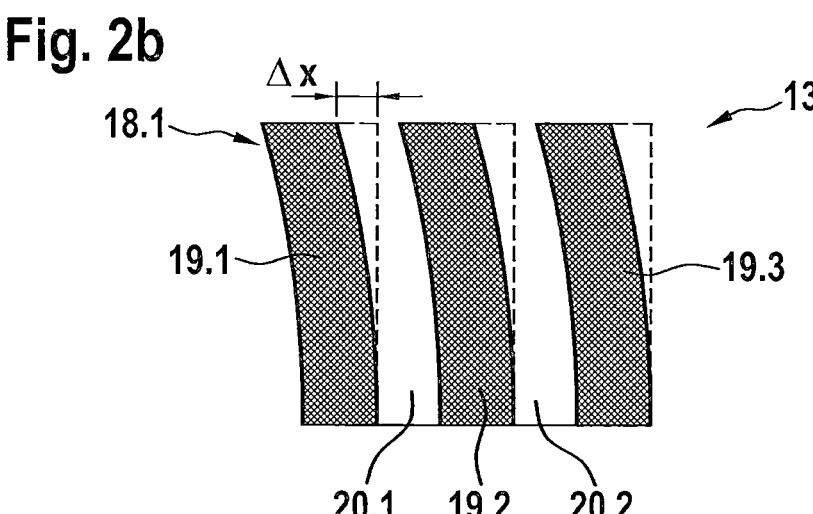

FIG. 2B shows a view of a detail of a diffractive element 13, in which a line grating 18.1 with a grating displaced locally by the value Δx is represented. In this case, the local phase shift m in relation to the zero order is given by $$\Phi_m(x,y)=2\pi*m\Delta x(x,y)/d$$

and the location dependency of Δx is given by $$\Delta x=W*d(x^2+y^2)/(\lambda R^2),$$

where
λ=the wavelength of the light,
R=the radius of the grating aperture,
W=a constant that determines the distance of the partial imagings in relation to one another
d=the fundamental period, and
$(x^2+y^2)/(R^2)$=a location-dependent distortion of the basic grating.

The effect of the first 19.x and second 20.x partial regions is as described under FIG. 2A.

Figure 2C:
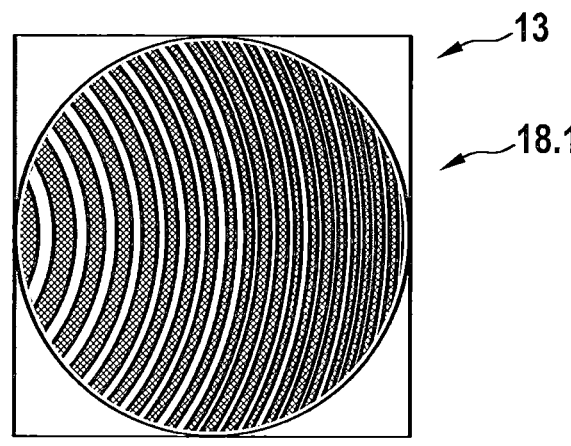

FIG. 2C shows a diffractive element 13 with a line grating 18.1 given by way of example, with W=3*λ.

Figure 3A:
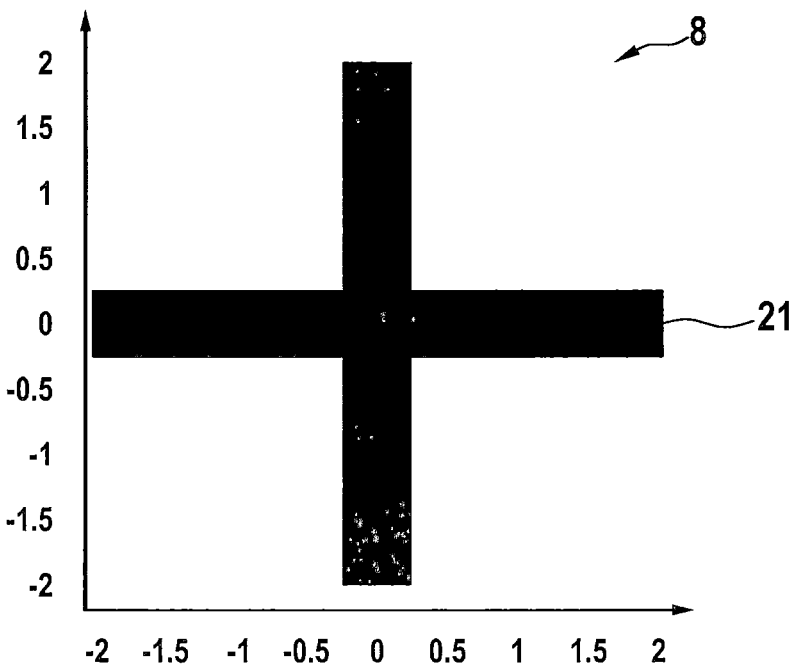
FIGS. 3A and 3B show a view of a detail of a structure and of a further diffractive element.

FIG. 3A shows a view of a detail of a photomask 8 in which a structure formed as a cross 21 is represented. The cross 21 has a dimension of 4 μm x 4 μm with a width of the bars of the cross of 0.5 μm, whereby, with nine partial imagings and a size of the image of 25 μm x 25 μm, crosstalk of the partial imagings is avoided.

Figure 3B:
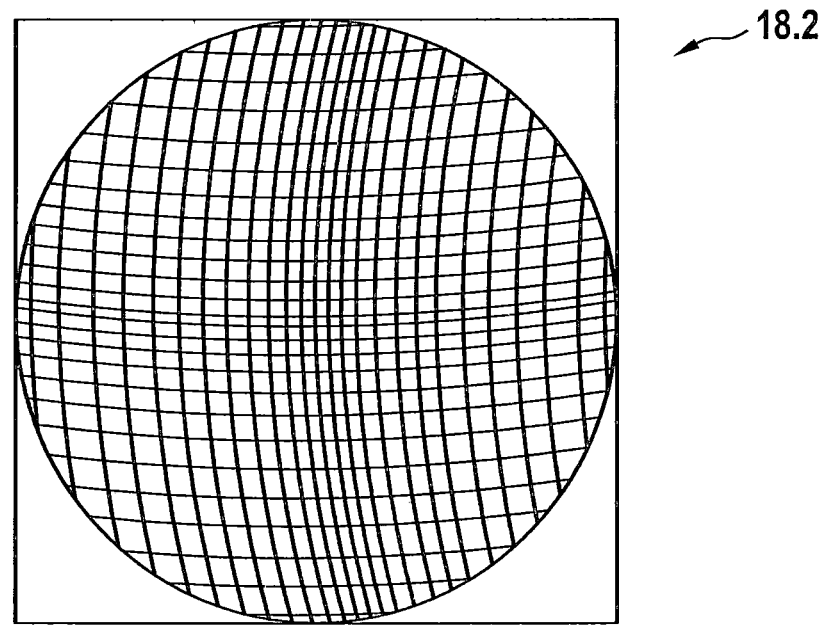

FIG. 3B shows a view of a detail of a schematically represented two-dimensional line grating 18.2, which is formed in accordance with the following formula:

$$\Phi_{m,n}(x,y)=2\pi*[m\Delta x(x,y)+n\Delta y(x,y)]/d$$

where $$\Delta x=W_x*d(x^2+y^2)/(\lambda R^2)$$

and $$\Delta y=W_y*d(x^2+y^2)/(\lambda R^2)$$

Figure 4A:
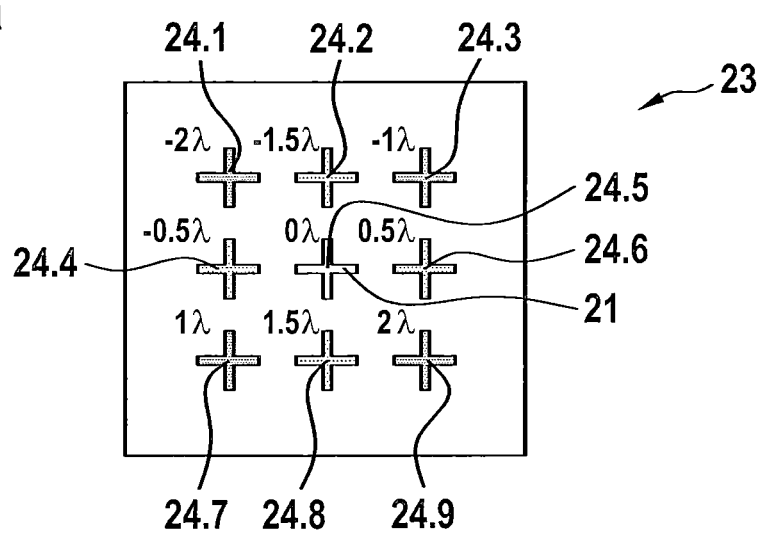
FIGS. 4A-4C show imaging captured by the device, a normalized imaging and a diagram of the determined contrast values.

FIG. 4A shows a view of a detail of an imaging 23 captured with the device on which nine partial imagings 24.x of the cross 21 described in FIG. 3A are represented. The defocusing between the partial imagings 24.x is in each case 0.5 k. The size of the imaging 23, which is predetermined by the CCD chip not shown, is 25 μm, so that there is no crosstalk. The intensities of the individual partial imagings 24.x are very different, which is brought about by the order of diffraction of the individual partial imagings 24.x. The higher the order of diffraction of the partial imaging 24.x, the less radiation energy is allocated to each partial imaging 24.x. This corresponds to the phenomenon of decreasing intensity of the diffraction maximums known from a single gap or double gap.

Figure 4B:
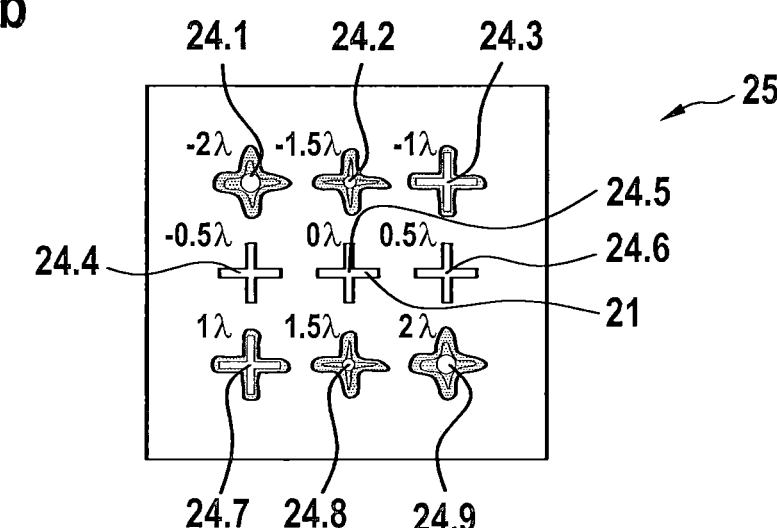

FIG. 4B shows a view of a detail of a normalized imaging 25 captured with the device, in which nine partial imagings 24.x of the cross 21 described in FIG. 3A are represented. The intensities of the partial imagings 24.x are normalized to the partial imaging 24.5 with the highest intensity. On the basis of the thus normalized intensities or energies, the contrast of the individual partial imagings 24.x is determined and the contrast value is plotted against the order of diffraction of the partial imaging 24.x.

Figure 4C:
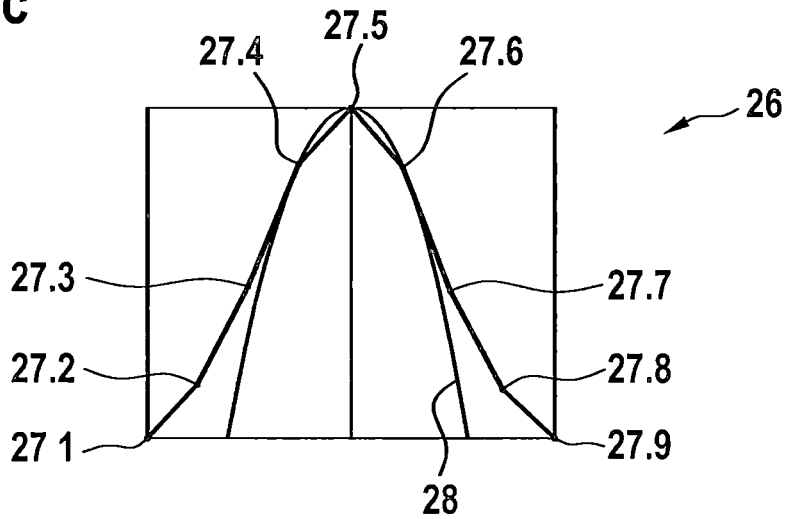

FIG. 4C shows a diagram in which the contrast values 27.x determined on the basis of the partial imagings 24.x represented in FIG. 4B are represented in a contrast evaluation 26. In this case, the contrast values 27.x are plotted against the order of the diffraction of the respective partial imaging 24.x. A continuous contrast profile is determined from the individual contrast values with a quadratic fit 28. The partial imaging 24.5 in FIG. 4B is that with the highest contrast value 27.5 in FIG. 4C. In this case, the partial imaging 24.5 is identical to the partial imaging 24.x with the smallest order of diffraction, from which it can be deduced that the partial region of the photomask that is being considered is positioned in the best focus.

Figure 5A:
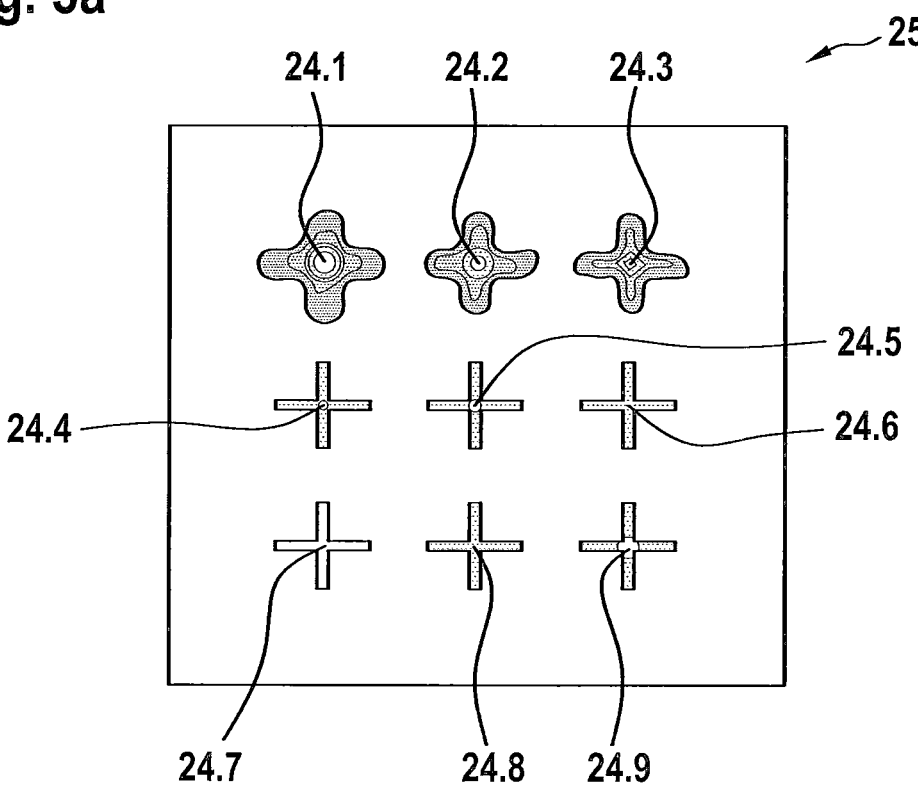
FIGS. 5A and 5B show a further, normalized imaging captured by the device and a diagram of the contrast values determined from it.

FIG. 5A shows a view of a detail of a normalized imaging 25 captured with the device, on which likewise nine partial imagings 24.x of the cross 21 described in FIG. 3A are represented.

Figure 5B:
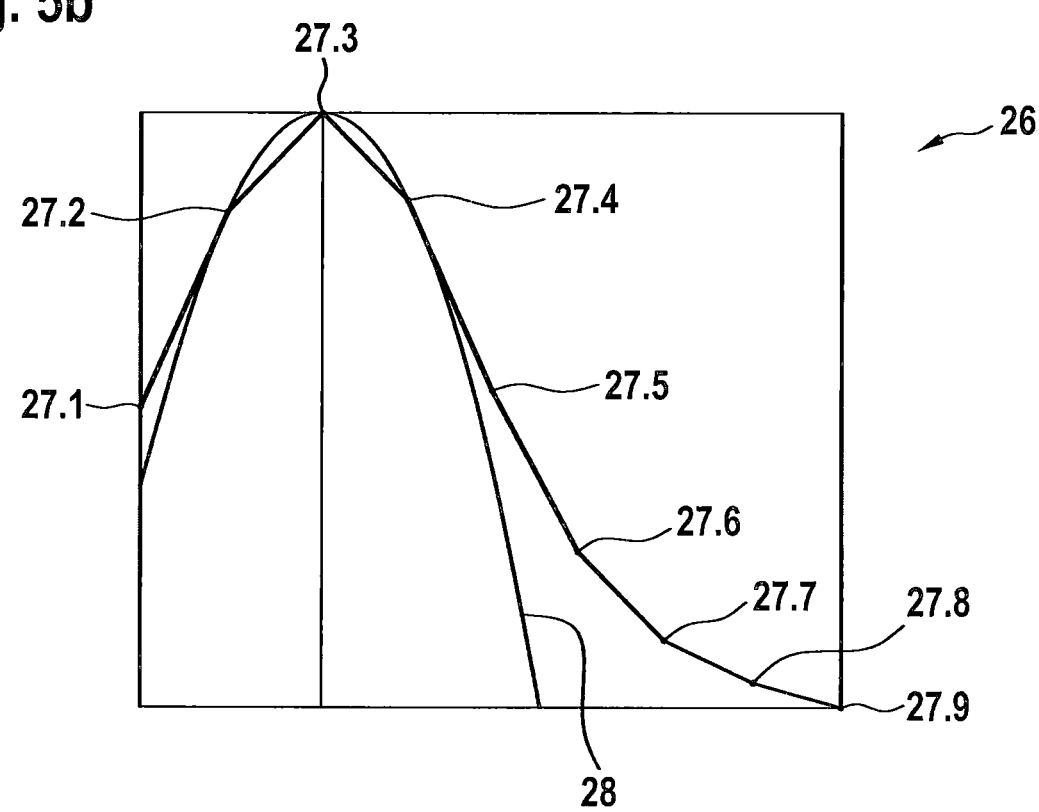

FIG. 5B shows the diagram corresponding to the partial imagings 24.x, in which the contrast values 27.x plotted against the order of diffraction are represented in a contrast evaluation 26. As in FIG. 4C, a quadratic fit 28 has been placed over the individual contrast values 27.x. The maximum contrast value 27.3 is determined for the partial imaging 24.7. In this case, the partial region of the photomask that is being considered has been displaced from the best focus by plus 1λ. Thus, the evaluation of the contrast values 27.x allows the distance of the photomask from best focus to be determined with just one captured imaging.

Figure 6A:
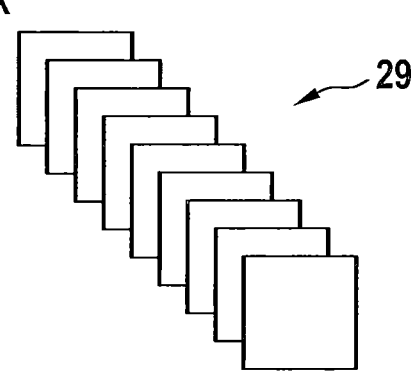
FIGS. 6A and 6B show a schematic representation of a focus stack from the prior art and an imaging captured by the device according to the invention with a number of partial imagings.

FIG. 6A shows a so-called focus stack 29 known from the prior art, that is to say nine imagings that have been recorded in each case with a different defocus in relation to one another, the displacement of the substrate expediently being carried out in the region of the expected best focus.

Figure 6B:
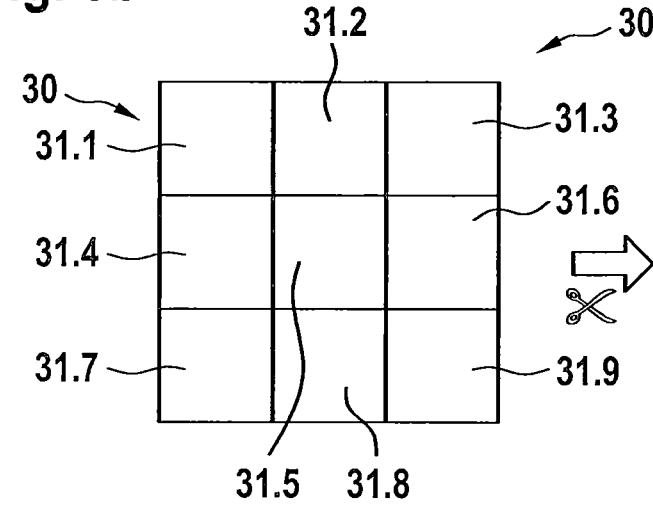
Figure 6B:
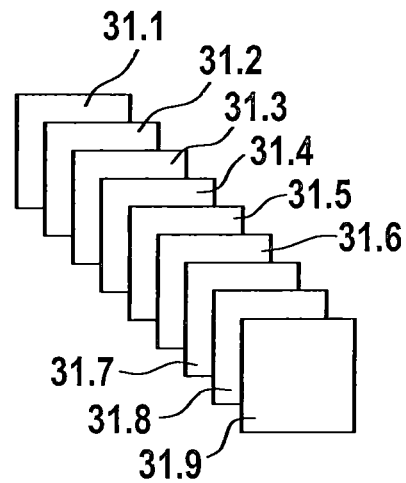

FIG. 6B shows an imaging 30 produced with a device represented in FIG. 1, which comprises nine partial imagings 31.x. These are divided into nine individual partial imagings 31.x during a post-processing of the imaging 30, as indicated in the figure by the arrow with the scissors symbol. In this way, a focus stack as defined by the prior art can be produced from just one captured imaging 30. This advantageously speeds up all processes that are based on such a focus stack, such as for example autofocusing of the photomask or the fixing of a process window for the imaging of a structure within predetermined tolerances.

Figure 7:
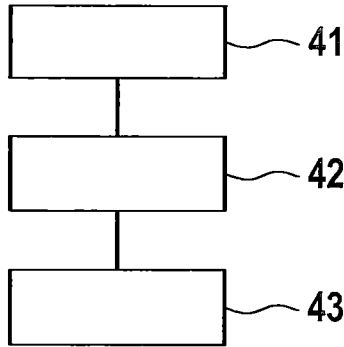
FIG. 7 shows a flow diagram of a method according to the invention.

FIG. 7 shows a flow diagram for a method according to the invention for measuring a substrate for semiconductor lithography with a measuring device, the measuring device comprising an imaging optical unit with a pupil.

In a first method step 41, a diffractive element 13 is arranged in the pupil 12 of the imaging optical unit 10.

In a second method step 42, the imaging of a partial region of the substrate 8 is captured.

In a third method step 43, the imaging is evaluated.

LIST OF REFERENCE SIGNS

1 Apparatus
2 Optical axis
3 Light source
4 Illumination optical unit
5 Optical element (illumination)
6 Stop
7 Field plane (illumination optical unit)
8 Photomask
9 Object plane
10 Imaging optical unit
11 Optical element (imaging)
12 Pupil (imaging system)
13 Diffractive elements
14 Multifocal grating

15 Image plane
16 Camera
17 CCD chip
18.1,18.2 Line grating
19.1-19.$x$ First partial region
20.1-20.$x$ Second partial region
21 Cross (object structure)
23 Imaging
24.1-24.$x$ Partial imaging
25 Normalized imaging
26 Contrast evaluation
27.1-27.$x$ Contrast values
28 Fit of the curve
29 Focus stack (prior art)
30 Imaging
31.1-31.$x$ Partial imaging
41 Method step 1
42 Method step 2
43 Method step 3

What is claimed is:

1. A device for measuring a substrate for semiconductor lithography, comprising an illumination optical unit for illuminating a region of the substrate, an imaging optical unit for imaging the substrate onto an image plane, and a recording device arranged in the image plane of the imaging optical unit,
    wherein a diffractive element is arranged in a pupil of the imaging optical unit and configured to produce multiple images of the illuminated region of the substrate on the recording device with different amounts of defocusing.

2. The device of claim 1,
wherein the illumination optical unit comprises a stop arranged in a field plane.

3. The device of claim 1,
wherein the diffractive element is formed as a grating.

4. The device of claim 1,
wherein the diffractive element is formed as an amplitude grating, a phase grating, or a combination of an amplitude grating and a phase grating.

5. The device of claim 1,
wherein the recording device is a camera.

6. The device of claim 3,
wherein the grating comprises a locally varying period in one direction.

7. The device of claim 3,
wherein the grating comprises a locally varying period in two directions perpendicular to one another.

8. The device of claim 3,
wherein the grating comprises a distortion corresponding to a non-paraxial wavefront of the defocus.

9. The device of claim 1,
wherein the different amounts of defocusing provided by the diffractive optical element correspond to imaging with different distances between the substrate and the imaging optical unit.

10. The device of Claim 1,
wherein the diffractive element is formed such that radiation energy is allocated equally to the individual multiple images with deviations of less than 2%.

11. The device of claim 1,
wherein the diffractive element is formed such that it can bring about aberrations of a higher order in the imaging.

12. The device of claim 11,
wherein the diffractive element is formed such that the aberrations of a higher order that are brought about by the diffractive element correct aberrations of a higher order of the imaging optical unit.

13. The device of claim 1,
wherein the diffractive element is formed such that it is adjustable.

14. The device of claim 1,
wherein the diffractive element can be pivoted into the pupil of the imaging optical unit.

15. The device of claim 1,
wherein the diffractive element is formed such that it is exchangeable.

16. The device of claim 1,
wherein the device comprises a magazine with a number of differently formed diffractive elements.

* * * * *